(12) United States Patent
Ito et al.

(10) Patent No.: US 6,507,014 B2
(45) Date of Patent: *Jan. 14, 2003

(54) ELECTRO-OPTIC PROBE

(75) Inventors: Akishige Ito, Tokyo (JP); Katsushi Ohta, Tokyo (JP); Toshiyuki Yagi, Tokyo (JP); Mitsuru Shinagawa, Isehara (JP); Tadao Nagatsuma, Sagamihara (JP); Junzo Yamada, Ebina (JP)

(73) Assignees: Ando Electric Co. Ltd. (JP); Nippon Telegraph and Telephone Corporation (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/080,768

(22) Filed: Feb. 22, 2002

(65) Prior Publication Data

US 2002/0092975 A1 Jul. 18, 2002

Related U.S. Application Data

(63) Continuation of application No. 09/409,997, filed on Sep. 30, 1999, now abandoned.

(30) Foreign Application Priority Data

Sep. 30, 1998 (JP) ............................................ 10-294566

(51) Int. Cl.[7] .............................. G01J 1/04; G01J 1/42; G01J 5/08
(52) U.S. Cl. ..................... 250/227.11; 324/96; 324/753; 359/247
(58) Field of Search ...................... 250/227.11; 324/753, 324/96, 750, 752; 359/247, 245, 251

(56) References Cited

U.S. PATENT DOCUMENTS

| 4,546,463 | A | * | 10/1985 | Opheij et al. ................ 369/110 |
| 4,841,234 | A | * | 6/1989 | Aoshima et al. ............... 324/96 |
| 5,122,895 | A | * | 6/1992 | Takanashi et al. .......... 359/247 |
| 5,157,460 | A | * | 10/1992 | Hino ........................... 356/365 |
| 5,677,635 | A | * | 10/1997 | Fujii et al. ................... 324/758 |
| 5,731,579 | A | * | 3/1998 | Woods ................... 250/227.17 |
| 5,808,473 | A | * | 9/1998 | Shinagawa et al. ......... 324/753 |
| 6,166,845 | A | * | 12/2000 | Ito et al. ...................... 359/245 |
| 6,337,565 | B1 | * | 1/2002 | Ito et al. ........................ 324/96 |

FOREIGN PATENT DOCUMENTS

| EP | 0293840 A3 | * | 12/1988 |
| WO | WO-8909413 | * | 10/1989 |
| WO | 9600905 | * | 1/1996 |

* cited by examiner

Primary Examiner—Stephone B. Allen
Assistant Examiner—Eric Spears
(74) Attorney, Agent, or Firm—Blakely Sokoloff Taylor & Zafman, LLP

(57) ABSTRACT

The present invention relates to an electro-optic probe, which includes the following components: a laser diode for emitting a modulating laser light according to control signals generated in a main body of the electro-optic sampling oscilloscope; a first lens for converting the modulating laser light to a parallel beam; a second lens for focusing the parallel beam; an opto-electronic element having a reflection film at a reflection-end; an isolator device disposed between the first lens and the second lens for transmitting the modulating laser light and separating a reflected beam produced at the reflection film into signal beams; and photo-diodes for converting optical energies of the signal beams separated by the isolator device into respective electrical signals; wherein, the signal beams to enter the photo-diodes are directed to propagate towards the laser diode, and the photo-diodes are disposed in a longitudinal direction of a probe casing.

19 Claims, 5 Drawing Sheets

ELECTRO-OPTIC PROBE

This is a Continuation of application Ser. No. 09/409,997 filed Sep. 30, 1999, now abandoned.

BACKGROUND OF THE INVENTION

1. Field of the Invention

The present invention relates in general to electro-optic probe for sampling oscilloscopes for observing waveforms according to polarization states of target signals produced by coupling electric fields formed by the target signals to an electro-optic crystal and injecting optical timing pulses into the electro-optic crystal, and relates in particular to an electro-optic probe having an improved optical system.

This application is based on a patent application No. Hei 10-294566 filed in Japan, the content of which is incorporated herein by reference.

2. Description of the Related Art

It is possible to observe waveforms of target signals, by coupling electric fields formed by the target signals to an opto-electronic crystal, and injecting laser light into the crystal and observing the polarization state of the laser light. If the laser light is pulsed, the modulated target signals can be analyzed with a fine resolution. An optical sampling oscilloscope uses an electro-optic probe based on this phenomenon.

Electro-optic sampling oscilloscope (shortened to EOS oscilloscope) has received much attention because of the following special features of the instrument, compared to an oscilloscope using a normal electric probe:

(1) signal measurement is facilitated because the scope does not require a ground line;

(2) there is virtually no effect on the behavior of the target signals because the metal pin used at the tip of the electro-optic probe is electrically isolated from the circuit system to provide a high input impedance: and (3) bandwidth of the measurable range is increased to a GHz range because optical pulses are used to modulate the target signals.

FIG. 5 shows a construction of a conventional electro-optic probe system comprised by: an electro-optic probe head 1 made of an electrical insulator having a metal pin 1a inserted in the center thereof; an electro-optic (e-o) crystal 2 having a reflection film 2a at the reflection-end, which is in contact with the metal pin 1a; collimating lenses 3, 8; a quarter-wave plate 4; polarizing beam splitters 5, 7; a Faraday element 6 for rotating the polarized plane of the injected light 45 degrees; a laser diode 9 for generating modulating laser light in response to modulating signals output from a pulsing circuit (not shown) provided in the main body 19 of the EOS oscilloscope; collimating lenses 10, 11; photo-diodes 12, 13 for converting the injected modulating laser light to electrical signals and outputting the electrical signals to the main body 19 of the EOS oscilloscope; an isolator device 14 comprised by the quarter-wave plate 4, the polarizing beam splitters 5, 7 and the Faraday element 6; and a probe casing 15 made of an electrical insulator.

Next, the optical path of the laser light generated from the laser diode 9 will be explained with reference to FIG. 5. In FIG. 5, incident laser beam is indicated by a letter A.

First, laser light emitted from the laser diode 9 is converted to a parallel beam of light by the collimating lens 8, and propagates in a straight line through the polarizing beam splitter 7, the Faraday element 6, and the polarizing beam splitter 5, and into the quarter-wave plate 4, and is focused by the collimating lens 3 to enter the e-o element 2. Incident light is reflected by the reflection film 2a formed on the surface at the reflection-end of the e-o element 2.

The reflected light is again converted to a parallel beam of light by the collimating lens 3, which passes through the quarter-wave plate 4, and a portion of the reflected beam is reflected at the polarizing beam splitter 5 and enters photo-diode 12, while the reflected light transmitting through the polarizing beam splitter 5 is reflected at the polarizing beam splitter 7 and enters photo-diode 13.

The quarter-wave plate 4 is for equalizing the intensities of the laser beams entering the photo-diodes 10,11.

The operation the electro-optic probe shown in FIG. 5 to measure target signals will be explained in the following.

When the metal pin 1a is made to contact a measuring point, Pockeles' effect is generated by the voltage applied to the metal pin 1a, thereby altering the birefringence of the e-o element 2 due to piezo-electric effect. This causes changes in the polarization states of the incident laser light emitted from the laser diode 9 and propagating through the e-o element 2. The incident beam, with altered polarization states, is reflected by the reflection film 2a, and the signal beams produced at the beam splitters 5, 7 are converted to electrical signals in the photo-diodes 12, 13.

As the voltage of the measuring point changes, the changes are manifested in the polarization states, represented by the differences in the output signals from the photo-diodes 12, 13, which are caused by the electrical signals being sensed by the metal pin 1a.

In the operation of the electro-optic probe explained above, the electrical signals obtained from the photo-diodes 12, 13 are input in the conventional EOS oscilloscope for processing; however, in place of this process, it is possible to measure target signals by using a conventional real-time measuring oscilloscope, by connecting it to the photo-diodes 12, 13 through dedicated controllers. This process permits measurements over a broad range of bandwidths using the conventional electro-optic probe.

However, in the design of the conventional electro-optic probe, because the optical axes of the photo-diodes 10,11 for receiving the signal beams generated at the reflection film 2a are placed transversely to the longitudinal optical axis of the injected laser light emitted from the laser diode 9, the terminals for the photo-diodes 10,11 are disposed in the radial direction of the probe casing 15. Furthermore, because the measuring cables are needed to be attached to the terminals, there is a need to provide transverse spaces to accommodate the cables, resulting in an excessive effective diameter of the probe casing 15. Because the probe is hand held by an operator to touch a measuring point such as a wiring junction in printed circuit board, such a bulky probe presents a serious impediment to delicate handling required in performing waveform measurements accurately.

SUMMARY OF THE INVENTION

It is an object of the present invention to provide an electro-optic probe having a slender probe casing to enable to carry out delicate measuring operations by reducing the diameter of the probe casing.

The object has been achieved in an electro-optic probe for an oscilloscope comprising:

a laser diode for emitting a modulating laser light according to control signals generated in a main body of the sampling oscilloscope;

a first lens for converting the modulating laser light to a parallel beam;

a second lens for focusing the parallel beam;

an opto-electronic element having a reflection film at a reflection-end;

an isolator device disposed between the first lens and the second lens for transmitting the modulating laser light and separating a reflected beam produced at the reflection film into signal beams;

and photo-diodes for converting optical energies of the signal beams separated by the isolator device into respective electrical signals; wherein, the signal beams to enter the photo-diodes are directed to propagate towards the laser diode, and the photo-diodes are disposed in a longitudinal direction of a probe casing.

Additionally, because the present design of the probe places the photo-diodes laterally with respect to the laser diode within a common plane, so as to enable to align the optical axis of the signal beams, entering the photo-diodes, parallel with the optical axis of the modulating laser light. emitted from the laser diode, by bending the signal beams ninety degrees at the polarizing beam splitters. This design enables the probe diameter to be minimized by eliminating the need for providing transverse spaces for the components, thereby producing a slender probe suitable for performing delicate waveform measurements accurately.

It should be noted that the reference numerals appended to particular components in the claims do not limit the technical interpretation of the claims.

DESCRIPTION OF THE PREFERRED EMBODIMENTS

Preferred embodiments of the electro-optic probe will be presented in the following with reference to the drawings.

Figure 1:
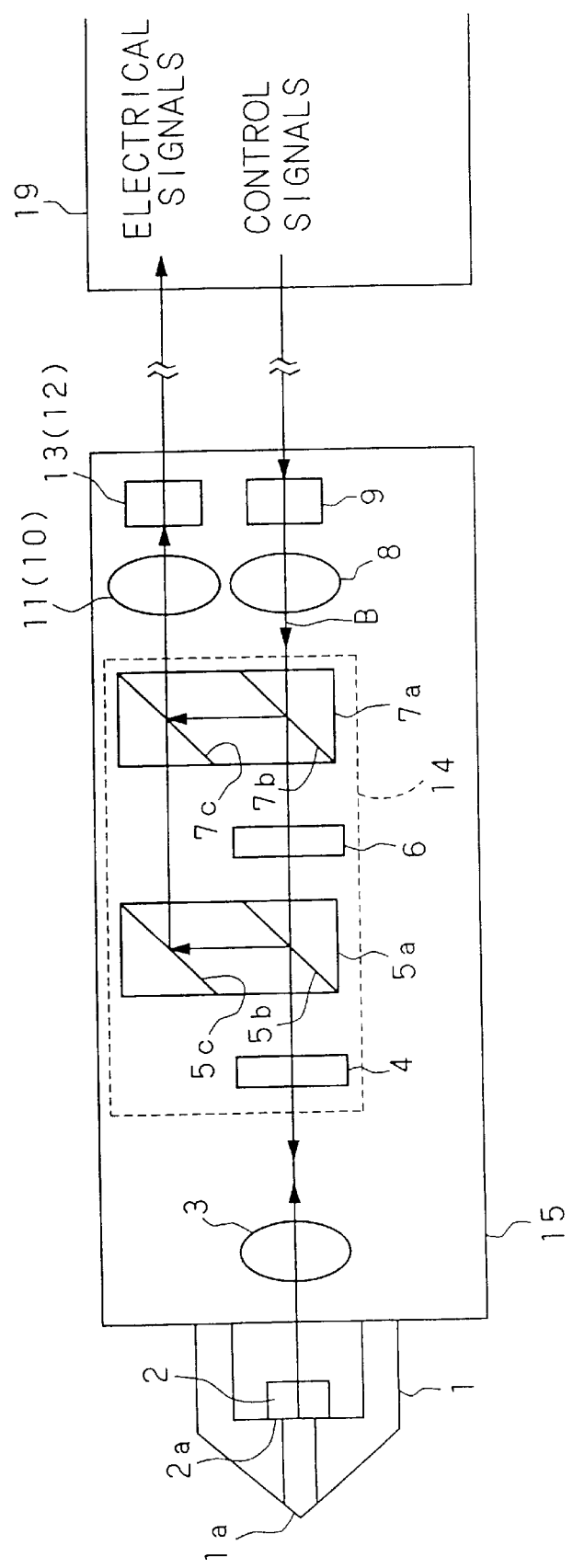
FIG. 1 is a schematic drawing of an embodiment of the electro-optic probe of the present invention.

FIG. 1 shows a schematic drawing of the structure of a first embodiment of the electro-optic probe (shortened to the probe hereinbelow). In FIG. 1, those parts that are the same as the conventional probe are referred to by the same reference numerals, and their explanations are omitted. The present probe differs from the conventional probe in the following respects. First, collimating lenses 10, 11 and photo-diodes 12, 13 are arranged so that the optical axes of the signal beams entering the photo-diodes 12, 13 will be parallel to the optical axis of the injected laser light emitted from the laser diode 9. Second, polarizing beam splitters 5a, 7a are shaped as a parallel four-sided block. The beam splitters 5a, 7a are produced by assembling two cube-shaped beam splitters, and are able not only to split the beam but bend the optical path of the signal beam at ninety degrees.

Figure 2:
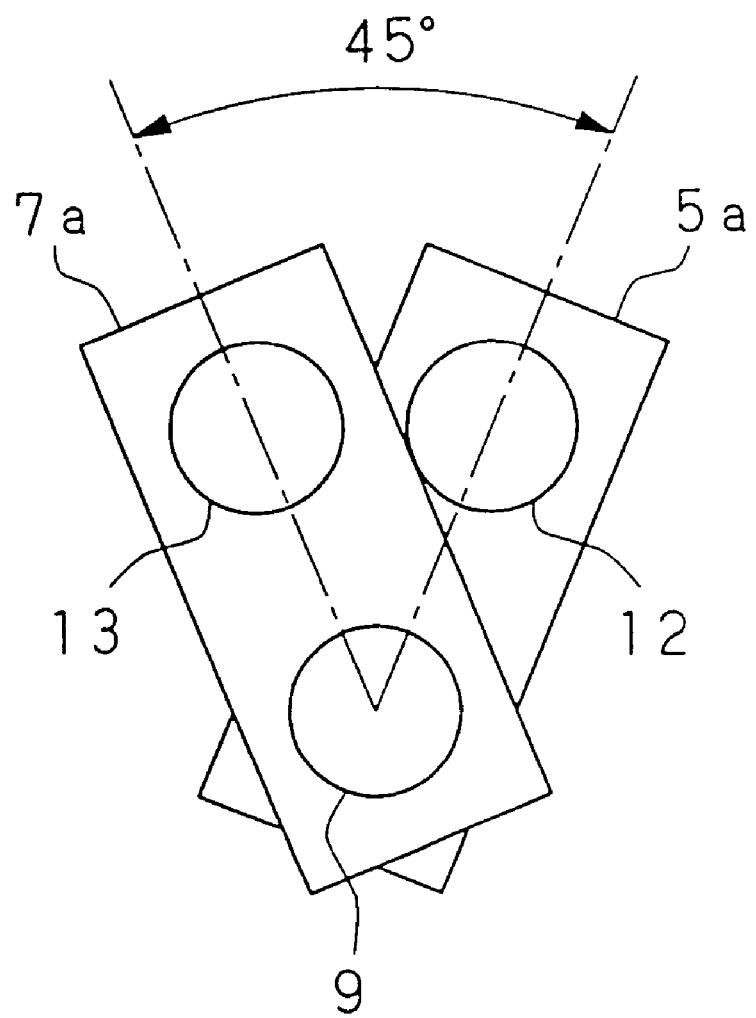
FIG. 2 is a schematic drawing for orienting the beam splitters 5a, 7a about the optical axis in the embodiment shown in FIG. 1.
Figure 3:
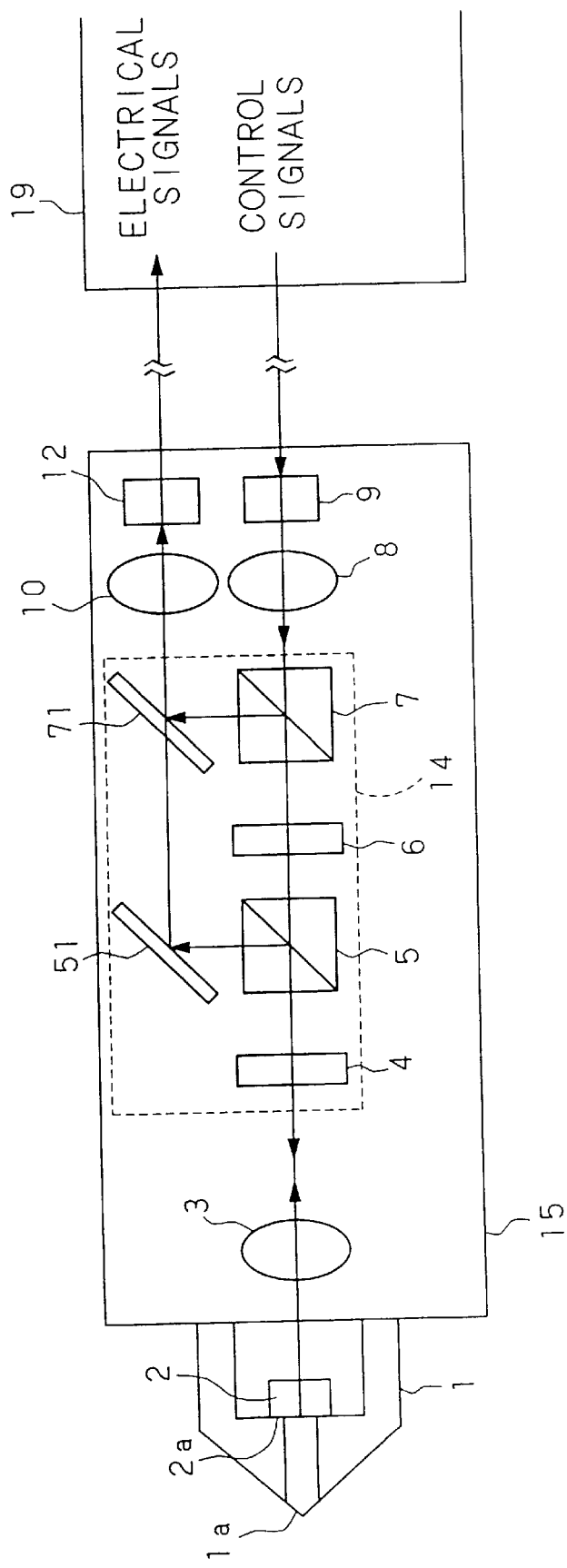
FIG. 3 is a schematic drawing of the structure of an alternative arrangement, using beam splitters 5, 7 and flat mirrors 51, 71 in replace of the beam splitters 5a, 7a shown in FIG. 1.

FIG. 2 shows an orientation relationship of the polarizing beam splitters 5a, 7a, photo-diodes 12, 13 and the laser diode 9. The drawing shows an end view seen along the longitudinal optical axis of the laser diode 9. As shown in FIG. 2, the polarizing beam splitters 5a, 7a are placed so that they are twisted 45 degrees about the optical axis of the laser diode 9. Therefore, the photo-diodes 12, 13 are similarly disposed so as to be twisted relative to each other at 45 degrees about the optical axis, thereby enabling the beams separated by the polarizing splitters 5a, 7a to be reflected into respective photo-diode 12, 13.

Next, the optical path of the laser beam emitted from the laser diode 9 will be explained with reference to FIG. 1. The optical path of the laser light is indicated by a letter B.

First, the laser light emitted from the laser diode 9 is converted into a parallel beam of light by the collimating lens 8, and is propagated in a straight line through the polarizing beam splitter 7a, the Faraday element 6, and the polarizing beam splitter 5a, and into the quarter-wave plate 4.

Next, the parallel beam transmitted through the quarter-wave plate 4 is focused by the collimating lens 3 to enter the e-o element 2, and is reflected by the reflection film 2a formed on the surface at the reflection-end of the e-o element 2. In this case, because the collimating lens 3 is placed at its focal point, the parallel beam produced by the collimating lens 10 focuses at one point on the reflection film 2a.

The reflected beam from the reflection film 2a is again collimated to a parallel beam by the collimating lens 3, passed through the quarter plate 4 once more, reflected at the reflection surface 5b of the polarizing beam splitter 5a, bent 90 degrees at the reflection surface 5c, focused by the collimating lens 10, and enters photo-diode 12. A portion of the laser beam transmitted through the polarizing beam splitter 5a is reflected by the reflection surface 7b of the polarizing beam splitter 7a, bent 90 degrees at the reflection surface 7c, focused by the collimating lens 11, and enters the photo-diode 13. The signal beams input in the photo-diodes 12, 13 are converted to electrical signals which are displayed on a display screen provided in the main body 19.

Accordingly, by placing the photo-diodes 12, 13 laterally on a plane common to the laser diode 9, the sensing elements of the photo-diodes 12, 13 face the longitudinal direction of the probe casing 15, thus eliminating the need for allowing transverse spaces for the wiring and enabling to provide a slender probe casing 15.

Further, the photo-diodes 12, 13 need not be necessarily coplanar with the laser diode 9 so long as they are placed in the longitudinal direction of the probe casing 15.

Also, it is not mandatory that the optical axis of the modulating light from the laser diode 9 be parallel to the optical axis of the signal light into the photo-diodes 12, 13, it is only required that the signal light into the photo-diodes 12, 13 be directed in the direction of the laser diode 9.

It should be noted that the polarizing beam splitter 5a, 7a can be constructed using cube-shaped beam splitters 5, 7 and flat mirrors 51, 71. The use of flat mirrors enables to reduce the cost of the optical components required to make an electro-optic probe.

Figure 4:
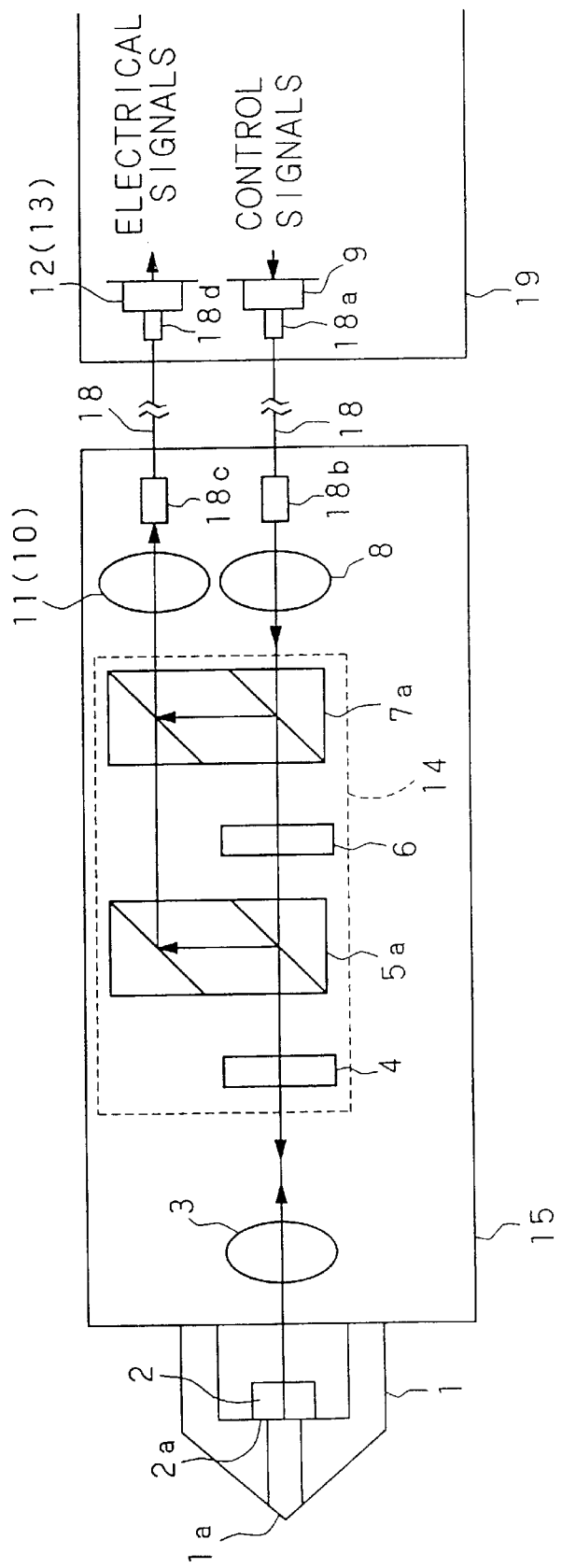
FIG. 4 is a schematic drawing of another embodiment of the electro-optic probe.
Figure 5:
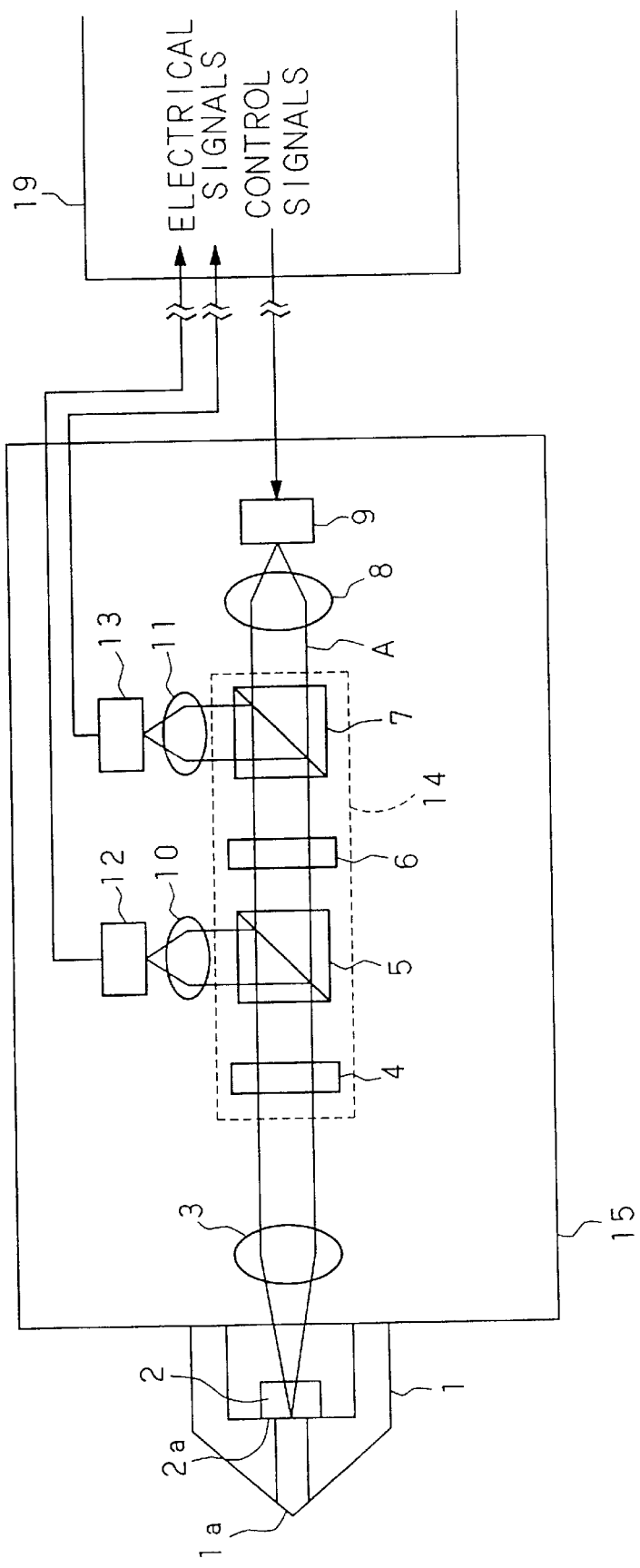
FIG. 5 is a schematic drawing of a conventional electro-optic probe in a EOS oscilloscope.

Another embodiment of the electro-optic probe will be presented with reference to FIG. 4.

This embodiment differs from the embodiment shown in FIG. 1 in the following respect: the laser diode 9 and the photo-diodes 12, 13 are placed in the main body 19 of the EOS oscilloscope, and the probe casing 15 and the main body 19 of the sampling scope communicates by way of optical fiber cables 18.

The optical path in the second embodiment will be explained with reference to FIG. 4.

First, modulating laser light emitted from the laser diode in the main body 19 enters the input end 18a of the fiber cable 18. The injected laser light propagates along the fiber cable 18, and leaves from the output end 18b and enters the collimating lens 8, which converts the light into a parallel beam.

The parallel beam is reflected, as in the first embodiment shown in FIG. 1, at the reflection film 2a, separated in the isolator device 14, and focused by the collimating lens 10, 11.

The focused signal beam enters the input end 18c of the cable 18, propagates through the fiber cable 18, and leaves from the output end 18d to enter the photo-diodes 12, 13.

Accordingly, by placing the laser diode 9 and the photo-diodes 12, 13 inside the main body 19 so that only the end terminals 18b, 18c of the fiber cable 18 are disposed on the probe casing 15, the need for providing spaces for the laser diode 9 and the photo-diodes 12, 13 inside the probe casing 15 can be eliminated.

Further, because wiring is no longer needed inside the probe casing 15, there is no need for providing any electrical shielding inside the probe casing 15, thereby making the probe even more slender and light weight.

It should be noted in the above embodiments that if the output light from the laser diode 9 is continuous, waveform measurements can be performed using general purpose conventional instruments such as real-time oscilloscope, sampling oscilloscope, or spectrum analyzer. In such a case, the laser diode 9 generates measuring light according to a control signal generated from a measuring instrument, and instead of the EOS oscilloscope, photo-diodes 12, 13 are connected to dedicated controllers so that measurements can be performed by the real-time oscilloscope, sampling oscilloscope or spectrum analyzer by way of the dedicated controllers.

On the other hand, by arranging the system so that the laser diode generates laser light according to control signals output from a controlling oscilloscope, the present electro-optic probe can be used with general purpose measuring instruments such as EOS oscilloscope or real-time oscilloscope to extend the measuring range to wide bandwidths.

What is claimed is:

1. An electro-optic probe for an electro-optic sampling oscilloscope comprising:
    a laser diode for emitting a modulating laser light according to control signals generated in a main body of said electro-optic sampling oscilloscope;
    a first lens for converting the modulating laser light to a parallel beam;
    a second lens for focusing said parallel beam;
    an opto-electronic channel having a reflection film at a reflection-end;
    isolator means disposed between said first lens and said second lens for transmitting said modulating laser light and separating a reflected beam produced at said reflection film into signal beams; and
    photo-diodes for converting optical energies of said signal beams separated by said isolator means into respective electrical signals, wherein;
    said photo-diodes are disposed in a longitudinal direction of a probe casing, and said signal beams separated by said isolator means are arranged to be parallel to said laser light emitted from said laser diode and to be apart from each other by a predetermined angle around said laser light.

2. An electro-optic probe according to claim 1, wherein said laser diode and said photo-diodes are provided inside said main body of said electro-optic sampling oscilloscope, and said modulating laser light emitted from said laser diode is propagated through an optical fiber cable to enter said probe, and signal beams separated by said isolator means are propagated through optical fiber cables to enter respective photo-diodes.

3. An electro-optic probe according to claim 2, wherein said isolator means include parallelogram-shaped beam splitters for aligning optical axes of signal beams parallel with an optical axis of said modulating laser light.

4. An electro-optic probe according to claim 3, wherein said photo-diodes and said laser diode are connected to an electro-optic sampling oscilloscope, and said laser diode generates pulsed light according to control signals produced by said electro-optic sampling oscilloscope.

5. An electro-optic probe according to claim 3, wherein said laser diode is a continuous-wave laser source.

6. An electro-optic probe according to claim 2, wherein said isolator means comprises cube-shaped beam splitters and flat mirrors for aligning an optical axis of signal beams separated by said beam splitters with an optical axis of said modulating laser light.

7. An electro-optic probe according to claim 6, wherein said photo-diodes and said laser diode are connected to an electro-optic sampling oscilloscope, and said laser diode generates pulsed light according to control signals produced by said electro-optic sampling oscilloscope.

8. An electro-optic probe according to claim 6, wherein said laser diode is a continuous-wave laser source.

9. An electro-optic probe according to claim 2, wherein said photo-diodes and said laser diode are connected to an electro-optic sampling oscilloscope, and said laser diode generates pulsed light according to control signals produced by said electro-optic sampling oscilloscope.

10. An electro-optic probe according to claim 2, wherein said laser diode is a continuous-wave laser source.

11. An electro-optic probe according to claim 1, wherein said isolator means include parallelogram-shaped beam splitters for aligning an optical axis of signal beams parallel with an optical axis of said modulating laser light.

12. An electro-optic probe according to claim 11, wherein said photo-diodes and said laser diode are connected to an electro-optic sampling oscilloscope, and said laser diode generates pulsed light according to control signals produced by said electro-optic sampling oscilloscope.

13. An electro-optic probe according to claim 11, wherein said laser diode is a continuous-wave laser source.

14. An electro-optic probe according to claim 11, wherein the parallelogram-shaped beam splitters are placed so that they are twisted by a predetermined angle about the optical axis of the laser diode.

15. An electro-optic probe according to claim 1, wherein said isolator means include cube-shaped beam splitters and flat mirrors so as to separate laser light by means of said splitters and align optical axes of signal beams parallel with an optical axis of a laser light by means of said flat mirrors.

16. An electro-optic probe according to claim 15, wherein photo-diodes and a laser diodes are connected to an electro-optic sampling oscilloscope, and said laser diode generates pulsed light according to control signals produced by said electro-optic sampling oscilloscope.

17. An electro-optic probe according to claim 15, wherein said laser diode is a continuous-wave laser source.

18. An electro-optic probe according to claim 1, wherein said photo-diodes and said laser diode are connected to an electro-optic sampling oscilloscope, and said laser diode generates pulsed light according to control signals produced by said electro-optic sampling oscilloscope.

19. An electro-optic probe according to claim 1, wherein said laser diode is a continuous-wave laser source.

* * * * *